(12) United States Patent
Watanabe et al.

(10) Patent No.: US 9,634,608 B2
(45) Date of Patent: Apr. 25, 2017

(54) CRYSTAL OSCILLATION CIRCUIT AND ELECTRONIC TIMEPIECE

(71) Applicant: Seiko Instruments Inc., Chiba-shi, Chiba (JP)

(72) Inventors: Kotaro Watanabe, Chiba (JP); Makoto Mitani, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/836,625

(22) Filed: Aug. 26, 2015

(65) Prior Publication Data

US 2016/0065132 A1  Mar. 3, 2016

(30) Foreign Application Priority Data

Sep. 3, 2014  (JP) .................. 2014-179420

(51) Int. Cl.
*H03B 11/00* (2006.01)
*H03B 5/36* (2006.01)
*H03B 5/32* (2006.01)
*H03B 5/30* (2006.01)
*H03L 5/00* (2006.01)
*G04G 3/00* (2006.01)

(52) U.S. Cl.
CPC .............. *H03B 5/364* (2013.01); *G04G 3/00* (2013.01); *H03B 5/30* (2013.01); *H03B 5/32* (2013.01); *H03B 5/366* (2013.01); *H03L 5/00* (2013.01); *H03B 2200/0062* (2013.01)

(58) Field of Classification Search
CPC .... H03L 5/00; H03B 5/30; H03B 5/32; H03B 5/364; H03B 5/366
USPC ................... 331/158, 116 R, 116 FE, 175
See application file for complete search history.

(56) References Cited

U.S. PATENT DOCUMENTS

| | | | |
|---|---|---|---|
| 8,044,731 B2 * | 10/2011 | Arai ...................... | H03B 5/366 331/109 |
| 2013/0002365 A1 * | 1/2013 | Zoppi ...................... | H03L 5/00 331/158 |
| 2013/0257550 A1 * | 10/2013 | Ishikawa .................. | H03L 5/00 331/109 |

FOREIGN PATENT DOCUMENTS

JP  2011-134347 A  7/2011

* cited by examiner

*Primary Examiner* — Arnold Kinkead
(74) *Attorney, Agent, or Firm* — Brinks Gilson & Lione

(57) ABSTRACT

To provide a crystal oscillation circuit low in current consumption and stably short in oscillation start time. A crystal oscillation circuit is equipped with a crystal vibrator, a feedback resistor, a bias circuit, a constant voltage circuit, and an oscillation inverter configured by a constant current inverter. The oscillation inverter is configured so as to be controlled by currents based on input signals from the bias circuit and the crystal vibrator and driven by an output voltage of the constant voltage circuit.

3 Claims, 5 Drawing Sheets

CRYSTAL OSCILLATION CIRCUIT AND ELECTRONIC TIMEPIECE

RELATED APPLICATIONS

This application claims priority under 35 U.S.C. §119 to Japanese Patent Application No. 2014-179420 filed on Sep. 3, 2014, the entire content of which is hereby incorporated by reference.

BACKGROUND OF THE INVENTION

Field of the Invention

The present invention relates to a crystal oscillation circuit which is low in current consumption and stably short in oscillation start time.

Background Art

As a crystal oscillation circuit used in an electronic timepiece or the like, there has been known such a configuration as shown in Patent Document 1. FIG. 5 is illustrated in a range not departing from the crystal oscillation circuit shown in Patent Document 1.

The crystal oscillation circuit 109 is comprised of PMOS transistors P31 and P32, NMOS transistors N31 and N32, capacitors C1, C2, C3 and C4, a feedback resistor 29, a constant current source 49, a constant voltage circuit 19, and a crystal vibrator 69.

An oscillation inverter configured by the PMOS transistor P31 and the NMOS transistor N31 is controlled by a current I9 which allows an operating current to flow through the constant current source 49. Thus, the crystal oscillation circuit is capable of reducing current consumption by reducing the current I9. Further, an amplitude limiter circuit comprised of the PMOS transistor P32 and the NMOS transistor N32 is capable of reducing current consumption of the crystal oscillation circuit by limiting the amplitude of a terminal XOUT. Furthermore, it is possible to reduce the current consumption of the crystal oscillation circuit by driving the crystal oscillation circuit by a constant voltage VREG outputted from the constant voltage circuit 19. Besides, the crystal oscillation circuit has also an effect in that an oscillation start time is made quick by the amplitude limiter circuit.

[Patent Document 1] Japanese Patent Application Laid-Open No. 2011-134347

SUMMARY OF THE INVENTION

The related art crystal oscillation circuit is however accompanied by the following problems.

There is a possibility that when the current I9 is made small, the crystal oscillation circuit will not be capable of oscillating. Further, there is a possibility that since the cutoff frequency of a high pass filter parasitically configured by the capacitor C2 and the constant current source 49 increases when the current I9 is made large, the crystal oscillation circuit will not be capable of oscillating. Therefore, the current I9 needed to be optimized. Further, the crystal oscillation circuit was accompanied by a drawback that when the current I9 varied, the oscillation start time became long.

In order to solve the related art problems, a crystal oscillation circuit of the present invention is configured as follows:

The crystal oscillation circuit is equipped with a crystal vibrator, a feedback resistor, a bias circuit, a constant voltage circuit, and an oscillation inverter configured by a constant current inverter. The oscillation inverter is controlled by currents based on input signals from the bias circuit and the crystal vibrator and driven by an output voltage of the constant voltage circuit.

According to the crystal oscillation circuit of the present invention, an advantageous effect is brought about in that the crystal oscillation circuit is low in current consumption and stably short in oscillation start time even if variations in process occur.

DETAILED DESCRIPTION OF THE PREFERRED EMBODIMENTS

The present embodiment will hereinafter be described with reference to the accompanying drawings.

Figure 1:
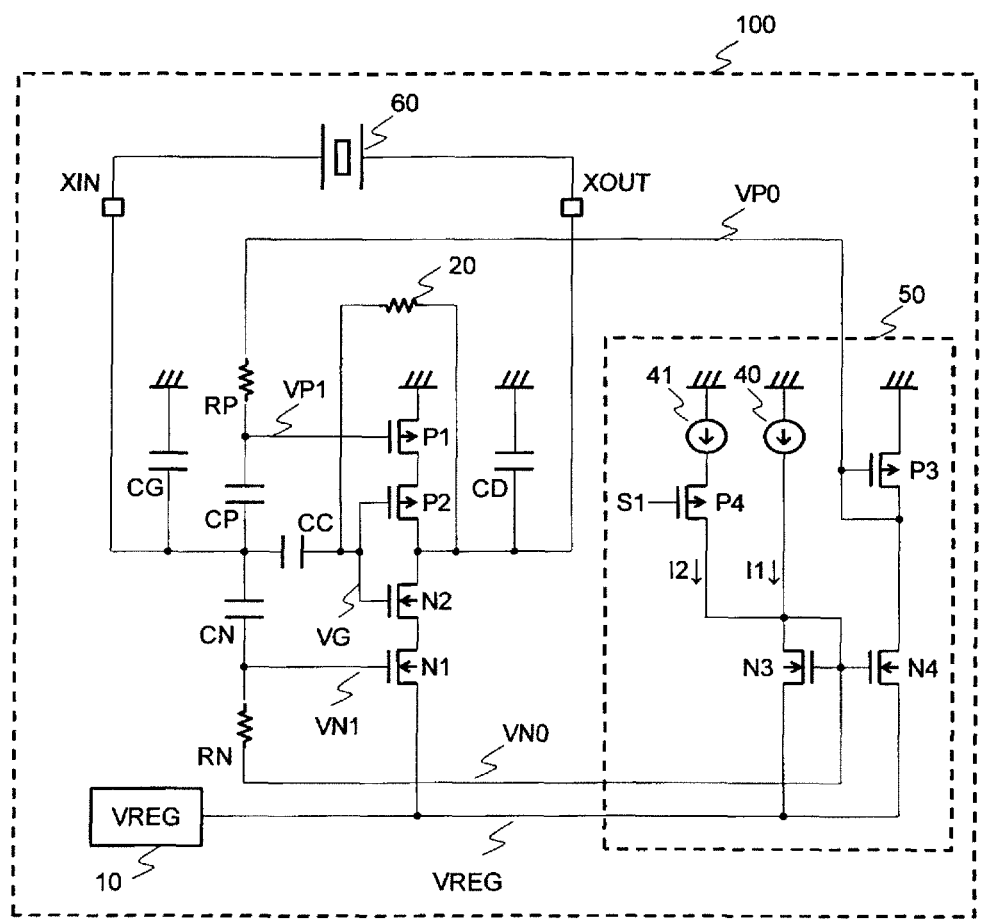
FIG. 1 is a circuit diagram illustrating a crystal oscillation circuit of the present embodiment.

FIG. 1 is a circuit diagram illustrating a crystal oscillation circuit of the present embodiment.

The crystal oscillation circuit 100 is comprised of PMOS transistors P1 and P2, NMOS transistors N1 and N2, capacitors CP, CN, CC, CG and CD, a feedback resistor 20, resistors RP and RN, a bias circuit 50, a constant voltage circuit 10, and a crystal vibrator 60. The bias circuit 50 is comprised of constant current sources 40 and 41, PMOS transistors P3 and P4, and NMOS transistors N3 and N4.

Figure 2:
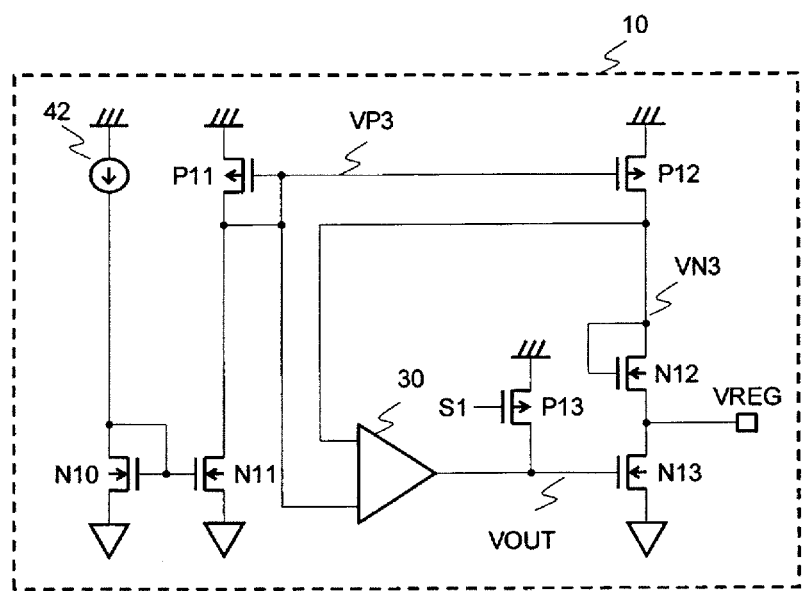
FIG. 2 is a circuit diagram illustrating one example of a constant voltage circuit of the crystal oscillation circuit of the present embodiment.

FIG. 2 is a circuit diagram illustrating one example of the constant voltage circuit of the crystal oscillation circuit of the present embodiment.

The constant voltage circuit 10 is comprised of a constant current source 42, PMOS transistors P11, P12, and P13, NMOS transistors N10, N11, N12, and N13, and a differential amplifier circuit 30.

A description will be made about connections of the crystal oscillation circuit of the present embodiment.

The PMOS transistor P2 has a source connected to a drain of the PMOS transistor P1, a gate connected to a node VG, and a drain connected to a node XOUT. The PMOS transistor P1 has a source connected to a power supply VDD and a gate connected to a node VP1. The NMOS transistor N2 has a source connected to a drain of the NMOS transistor N1, a gate connected to the node VG, and a drain connected to the node XOUT. The NMOS transistor N1 has a source connected to an output terminal (node VREG) of the constant voltage circuit 10 and a gate connected to a node VN1. The feedback resistor 20 has one end connected to the node VG and the other end connected to the node XOUT. The capacitor CC has one end connected to a node XIN and the other end connected to the node VG. The capacitor CP has one end connected to the node XIN and the other end connected to the node VP1. The capacitor CN has one end connected to the node XIN and the other end connected to the node VN1. The capacitor CG has one end connected to the node XIN and the other end connected to the power supply VDD. The capacitor CD has one end connected to the node XOUT and the other end connected to the power supply VDD. The resistor RP has one end connected to the node VP1 and the other end connected to an output terminal (node VP0) of the bias circuit 50. The resistor RN has one end connected to the node VN1 and the other end connected to an output terminal (node VN0) of the bias circuit 50. The crystal vibrator 60 has one end connected to the node XIN and the other end connected to the node XOUT.

A description will be made about connections of the bias circuit 50.

The constant current source 40 has one end connected to the power supply VDD and the other end connected to the node VN0. The constant current source 41 has one end connected to the power supply VDD and the other end connected to a source of the PMOS transistor P4. The PMOS transistor P4 has a drain connected to the node VN0 and a gate to which a signal S1 is inputted. The NMOS transistor N3 has a source connected to the node VREG and a gate and drain connected to the node VN0. The NMOS transistor N4 has a source connected to the node VREG, a gate connected to the node VN0, and a drain connected to the node VP0. The PMOS transistor P3 has a source connected to the power supply VDD and a gate and drain connected to the node VP0.

A description will be made about connections of the constant voltage circuit 10.

The constant current source 42 has one end connected to the power supply VDD and the other end connected to a gate and drain of the NMOS transistor N10. The NMOS transistor N10 has a source connected to a power supply VSS. The NMOS transistor N11 has a source connected to the power supply VSS, a gate connected to the gate of the NMOS transistor N10 and a drain connected to a node VP3. The PMOS transistor P11 has a source connected to the power supply VDD and a gate and drain connected to the node VP3. The PMOS transistor P12 has a source connected to the power supply VDD, a gate connected to the node VP3, and a drain connected to a node VN3. The NMOS transistor N12 has a source connected to the node VREG and a gate and drain connected to the node VN3. The NMOS transistor N13 has a source connected to the power supply VSS, a gate connected to an output terminal (node VOUT) of the differential amplifier circuit 30, and a drain connected to the node VREG. The PMOS transistor P13 has a source connected to the power supply VDD, a drain connected to the node VOUT, and a gate to which the signal S1 is inputted.

The PMOS transistors P1 and P2 and the NMOS transistors N1 and N2 configure an oscillation inverter. The current which flows through the oscillation inverter is a drive current.

The bias circuit 50 outputs voltages VP0 and VN0 for determining gate voltages of the PMOS transistor P1 and the NMOS transistor N1. Further, for example, the PMOS transistors P3 and P4 and the NMOS transistors N3 and N4 are respectively configured in the same size, and a current I1 of the constant current source 40 flows through each transistor. The current flowing through each transistor is however not limited to the current I1 in particular, but may be set as appropriate to satisfy such functions as described below.

The constant voltage circuit 10 outputs a voltage VREG with the power supply VDD as the reference from the output terminal at normal operation and outputs the voltage of the power supply VSS at the start of oscillation. The voltage VREG is a voltage proportional to the sum of threshold voltages VTH of the PMOS transistor P11 and the NMOS transistor N12 by the function of the differential amplifier circuit 30. The constant voltage circuit 10 shown in FIG. 2 is one example, but not limited to it if there is provided a circuit which outputs such a voltage VREG as described above.

A description will be made about the operation of the crystal oscillation circuit of the present embodiment configured as described above.

[At Normal Operation]

Figure 3:
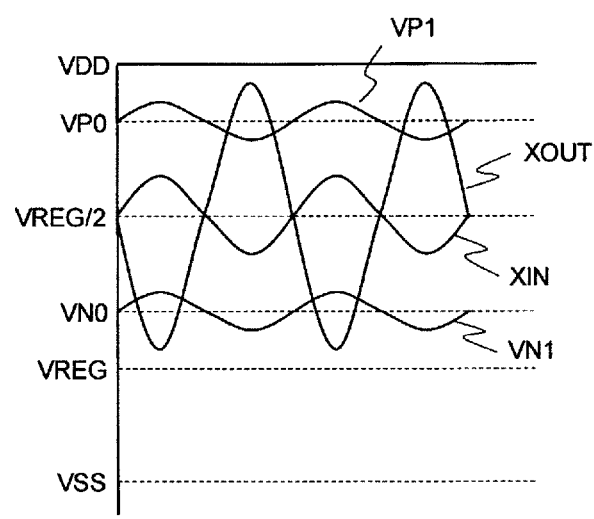
FIG. 3 is a diagram illustrating the operation of the crystal oscillation circuit of the present embodiment.

FIG. 3 is a diagram illustrating the operation of the crystal oscillation circuit of the present embodiment.

The signal S1 is at a High level at normal operation. Since the PMOS transistor P13 is turned OFF, the constant voltage circuit 10 outputs the voltage VREG to the output terminal thereof. Thus, the voltages of the nodes XIN and XOUT of the crystal oscillation circuit 100 vibrate about a voltage VREG/2. Since the signal S1 is at the High level, the PMOS transistor P4 of the bias circuit 50 is OFF. Therefore, the node VN0 assumes a voltage determined by the current I1 of the constant current source 40 and a threshold voltage VTH of the NMOS transistor N3. The node VN1 is connected to the node VN0 through the resistor RN and coupled to the node XIN by the capacitor CN. Therefore, the voltage of the node VN1 vibrates in the same phase as the node XIN about the voltage of the node VN0. Likewise, the node VP0 assumes a voltage determined by the current I1 of the constant current source 40 and a threshold voltage VTH of the PMOS transistor P3. Since the node VP1 is connected to the node VP0 through the resistor RP and coupled to the node XIN by the capacitor CP, the voltage of the node VP1 vibrates in the same phase as the node XIN about the voltage of the node VP0.

When the voltage of the node XOUT is closest to the voltage of the power supply VDD, i.e., the PMOS transistor P2 is ON, the voltage of the node VP1 is lower than the voltage of the node VP0. Thus, the current made to flow by the PMOS transistor P1 becomes more than the current I1. Further, since the voltage of the node VN1 is also lower than the voltage of the node VN0, the current made to flow by the NMOS transistor N1 is smaller than the current I1.

Further, when the voltage of the node XOUT is closest to the voltage VREG, i.e., the NMOS transistor N2 is ON, the voltage of the node VN1 is higher than the voltage of the node VN0. Thus, the current made to flow by the NMOS transistor N1 becomes more than the current I1. Further, since the voltage of the node VP1 is also higher than the voltage of the node VP0, the current made to flow by the PMOS transistor P1 becomes smaller than the current I1.

Thus, it is possible to reduce a through current while optimally operating the oscillation inverter configured by the PMOS transistors P1 and P2 and the NMOS transistors N1 and N2 as a constant current inverter. Further, since the current I1 can be minimized, current consumption of the bias circuit 50 can also be reduced, thus making it possible to reduce current consumption of the crystal oscillation circuit.

Further, since the voltage of the node XOUT which serves as the output of the oscillation inverter vibrates about the voltage VREG/2, the current to charge or discharge the capacitor CD and the crystal vibrator 60 depends on the voltage VREG. Thus, the charging and discharging current is minimized by reducing the voltage VREG to thereby enable the current consumption of the crystal oscillation circuit to be reduced. The constant voltage VREG is however required to be set so as not to fall below an oscillation stop voltage.

[At the Start of Oscillation]

At the oscillation start, the signal S1 is set to a Low level for a preset period.

Since the PMOS transistor P4 of the bias circuit 50 is turned ON when the signal S1 is brought to the Low level, the driving current of the crystal oscillation circuit 100 becomes the sum of the current I1 of the constant current source 40 and a current I2 of the constant current source 41. Increasing the driving current makes the currents flowing through the PMOS transistor P1 and the NMOS transistor N1 sufficiently large. Thus, the oscillation inverter is operated like a CMOS inverter configured by the PMOS transistor P2 and the NMOS transistor N2 without operating as the constant current inverter. Accordingly, the crystal oscillation circuit 100 enables the oscillation start time to be made quick stably.

Since the PMOS transistor P13 of the constant voltage circuit 10 is turned ON when the signal S1 becomes the Low level, the NMOS transistor N13 is turned ON so that the voltage of the power supply VSS is outputted to the output terminal of the constant voltage circuit 10. Thus, since the driving voltage of the oscillation inverter becomes the voltage between the power supply VDD and the power supply VSS, the oscillation start time can stably be made quick.

As described above, the crystal oscillation circuit 100 enables the oscillation start time to be stably made quick by increasing the driving current and voltage of the oscillation inverter at the oscillation start more than at the normal operation. Thus, since it is possible to reduce the driving current of the oscillation inverter and lower its driving voltage during the oscillation operation, current consumption can be reduced without sacrificing the oscillation start time.

Incidentally, although a description has been made about the configuration in which the driving current at the oscillation start is increased by the constant current source 41 and the PMOS transistor P4, another circuit configuration may be used. For example, the mirror ratios between the NMOS transistors N3 and N1 and the PMOS transistors P1 and P2 which respectively form current mirrors may be changed at the oscillation start. Further, at the oscillation start, the node VN1 may be connected to the power supply VDD and the node VP1 may be connected to the power supply VSS.

Figure 4:
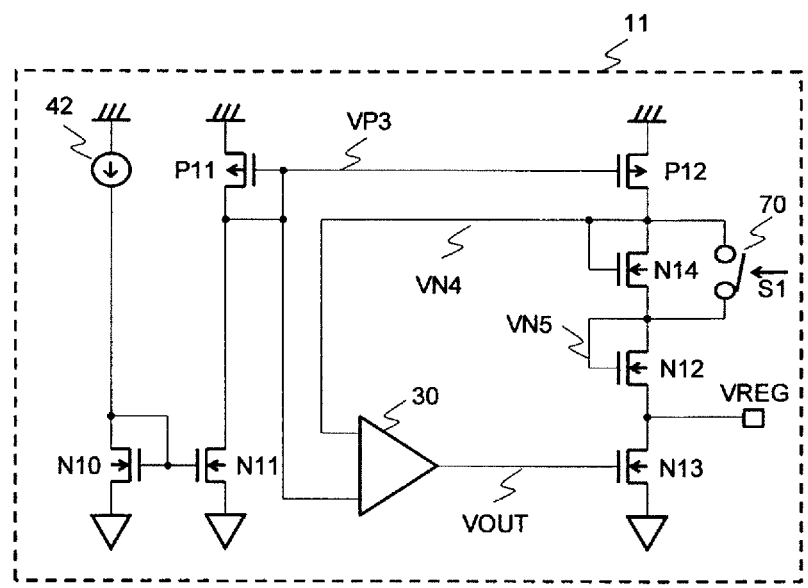
FIG. 4 is a circuit diagram illustrating another example of the constant voltage circuit of the crystal oscillation circuit of the present embodiment.
Figure 5:
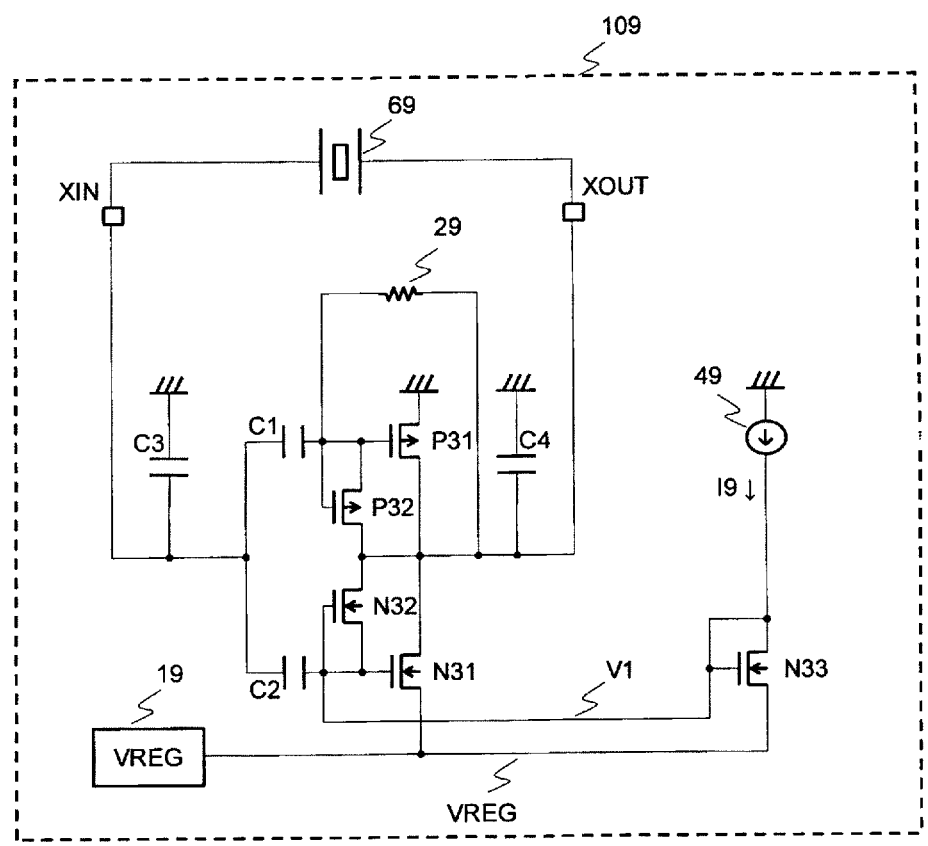
FIG. 5 is a circuit diagram illustrating a related art crystal oscillation circuit.

FIG. 4 is a circuit diagram illustrating another example of the constant voltage circuit of the crystal oscillation circuit of the present embodiment.

The constant voltage circuit 11 is equivalent to one in which the PMOS transistor P13 is deleted from the constant voltage circuit 10 and an NMOS transistor N14 and a SW70 are further added.

The NMOS transistor N14 has a source connected to a node VN5 and a gate and drain connected to a node VN4. The SW70 has one end connected to the node VN4, the other end connected to the node VN5, and a control terminal to which a signal S1 is inputted. The SW70 is turned ON when the signal S1 is at a High level and turned OFF when the signal S1 is at a Low level, for example.

[At Normal Operation]

Since the signal S1 is at the High level at the normal operation, the SW70 is kept ON. Thus, the constant voltage circuit 11 is set to an operation similar to the normal time of the constant voltage circuit 10.

[At Oscillation Start]

At the start of oscillation, the signal S1 is brought to a Low level for a preset period.

Since the signal S1 is at the Low level, the SW70 of the constant voltage circuit 11 is OFF. Thus, a voltage VREG proportional to the sum of the threshold voltages VTH of the PMOS transistor P11, the NMOS transistor N12, and the NMOS transistor N14 is outputted to an output terminal of the constant voltage circuit 11. Since the voltage VREG is increased by the threshold voltage VTH of the NMOS transistor N14 as compared with the voltage at the normal operation, the oscillation start time can be made quick.

The crystal oscillation circuit has a possibility of making a transition to high-frequency oscillation when the driving voltage is high, but brings about an advantageous effect in that since the voltage VREG outputted from the constant voltage circuit 11 is a voltage larger by the threshold voltage VTH of the NMOS transistor N14 than the output voltage at the normal operation, high-frequency oscillation can be prevented and the oscillation start time is made quick.

As described above, the crystal oscillation circuit 100 is capable of making the oscillation start time quick stably by increasing the driving current and voltage of the oscillation inverter at the oscillation start more than at the normal operation. Thus, since it is possible to reduce the driving current of the oscillation inverter and lower its driving voltage upon the normal operation, current consumption can be reduced without sacrificing the oscillation start time. Accordingly, the crystal oscillation circuit of the present invention is most suitable for an electronic timepiece or the like which requires a crystal oscillation circuit low in current consumption and stably short in oscillation start time.

Incidentally, the configuration of the crystal oscillation circuit of the present embodiment is one example but can be modified within the scope not departing from the scope of claims.

Further, the bias circuit 50 may be shared as a partial circuit of the constant voltage circuit 10. For example, the nodes VP0 and VN0 of the crystal oscillation circuit 100 are respectively connected to the nodes VP3 and VN3 of the constant voltage circuit 10. Being configured in this way enables a reduction in chip area.

Further, as the resistors RP and RN, a transmission gate, a voltage follower circuit, etc. may be used in place of their resistive elements.

Furthermore, although a description has been made about the case where both of the driving current and voltage are changed at the oscillation start, either of them may be changed.

What is claimed is:

1. A crystal oscillation circuit, comprising:
   a crystal vibrator;
   a feedback resistor;
   a bias circuit;
   a constant voltage circuit; and
   an oscillation inverter configured by a constant current inverter comprising a current source transistor and a transistor configuring an inverter that are connected in series, wherein a gate of the current source transistor is connected to an output terminal of the bias circuit through a resistor and connected to an input terminal of the crystal vibrator through a capacitor
   said oscillation inverter being controlled by currents based on input signals from the bias circuit and the crystal vibrator and driven by an output voltage of the constant voltage circuit.

2. The crystal oscillation circuit according to claim 1, wherein at least either of the output voltage of the constant voltage circuit and the currents based on the input signals is increased at the start of oscillation.

3. An electronic timepiece equipped with the crystal oscillation circuit according to claim 1.

* * * * *